United States Patent [19]

Dent

[11] Patent Number: 5,148,373
[45] Date of Patent: Sep. 15, 1992

[54] METHOD AND AN ARRANGEMENT FOR ACCURATE DIGITAL DETERMINATION OF THE TIME OR PHASE POSITION OF A SIGNAL PULSE TRAIN

[75] Inventor: Paul W. Dent, Stehag, Sweden

[73] Assignee: Telefonaktiebolaget L M Ericsson, Stockholm, Sweden

[21] Appl. No.: 501,766

[22] Filed: Mar. 30, 1990

[30] Foreign Application Priority Data

Apr. 20, 1989 [SE] Sweden .............................. 8901441

[51] Int. Cl.⁵ ............................................ G06F 15/20
[52] U.S. Cl. .................................. 364/484; 364/483; 370/6
[58] Field of Search ............. 364/483, 571.02, 715.06, 364/484; 370/6

[56] References Cited

U.S. PATENT DOCUMENTS

| | | |
|---|---|---|
| 4,104,586 | 8/1978 | Newbould et al. ............. 324/83 D |
| 4,178,631 | 12/1979 | Nelson, Jr. ......................... 364/484 |
| 4,183,087 | 1/1980 | Huelsman ...................... 364/715.06 |
| 4,318,617 | 3/1982 | Orsen .............................. 364/571.02 |
| 4,800,508 | 1/1989 | Frederich ........................... 364/484 |
| 4,918,636 | 4/1990 | Iwata et al. .................... 364/715.06 |
| 4,928,105 | 5/1990 | Langner ............................. 364/484 |
| 4,979,215 | 12/1990 | Fontanes et al. .................. 364/484 |
| 4,996,647 | 2/1991 | Gasser ............................... 364/484 |
| 4,998,219 | 3/1991 | Frauenglass ................... 364/715.06 |

FOREIGN PATENT DOCUMENTS 0265080 9/1987 European Pat. Off. .
3153249 12/1988 Fed. Rep. of Germany .

OTHER PUBLICATIONS

Cleveland et al.; "Lowest Bit Detector"; vol. 16, No. 2, Jul. 1973; IBM Technical Disclosure.

Murthy; "Digital Extremum Calculator"; Wireless World; Nov. 1978.

Primary Examiner—Parshotam S. Lall
Assistant Examiner—Ellis B. Ramirez
Attorney, Agent, or Firm—Burns, Doane, Swecker & Mathis

[57] ABSTRACT

The invention relates to a method and an apparatus for accurate digital determination of the time or phase position of a signal pulse train in relation to a fixed time or frequency reference. The arrangement generates and produces directly on the output a digital word corresponding to the measuring value current at that time. The pulse train is compared in a plurality of EXCLUSIVE-OR gates (OR0-OR3) with a number of reference clock signals (RCL0-RCL3) which are mutually displaced in time. There is produced on the output of each gate a signal (MS0-MS3) which is dependent on the input signals of the gates with respect to frequency and pulse ratio. The output signals from the gates are sent to a comparison circuit (CO) in which MIN of MAX operation is carried out, the pulse ratio of the output signals (MS0-MS3) being compared and the output signal which lies nearest to a predetermined pulse-ratio value being subjected to analogue/digital conversion in a converter (AD). The pulse train, in digital form, is thereafter code-converted in a code converter (CC) together with the three most significant bits taken from the pulse train prior to the AD-conversion process. The thus produced binary code can be corrected for systematic deviations resulting from frequency differences between the frequency, reference frequency and/or sampling frequency of the pulse train, by the addition/subtraction of a predetermined numeric sequence.

9 Claims, 3 Drawing Sheets

METHOD AND AN ARRANGEMENT FOR ACCURATE DIGITAL DETERMINATION OF THE TIME OR PHASE POSITION OF A SIGNAL PULSE TRAIN

TECHNICAL FIELD

The present invention relates to a method and an arrangement for accurate digital determination of the time or phase position of a signal pulse train relative to a fixed time or frequency reference. The arrangement is operative to generate a digital word which corresponds to the measurement value which is current at that time and produces said value directly on its output.

BACKGROUND ART

Two main methods for determining the time or phase position of a signal pulse train are known to the art. These methods are known respectively as the zero-crossing timing method and the complex vector method.

When practising the zero-crossing method, the desired time information is obtained by registering the position in a reference-divider chain at those moments when the pulse train changes sign.

The time resolution obtained with this method is quite simply one period of the highest reference frequency signal produced on the input of the reference frequency-divider chain. For example, in order to determine the phase position of a pulse train having a repetition frequency of 1 MHZ with a resolution of 1 degree, it would be necessary to apply a frequency of 360 MHZ to the input of the frequency-divider chain. Consequently, the logic used to determine the phase would need to be very fast, even in the case of low-frequency pulse trains of moderate resolution.

When practising the complex vector method, the information desired is assumed to be included in the fundamental sine component of the pulse train. This sine component is filtered-out and resolved into two quadrature components, by correlation with sine and cosine reference-frequencies in balanced mixers. Consequently, it is then necessary to digitize the two results and to process the arc-tangent of their ratio in a computer in order to determine the phase.

DISCLOSURE OF THE INVENTION

The problem with the first of these methods is that it requires the use of highly advanced logic, even when carrying out relatively simple phase measurements.

The problem with the second method is that imperfections in the analogue correlators introduce serious limitations into the method in practice, and the need to process the arc-tan in a computer adds greatly to the complexity of the method.

The inventive arrangement is characterized by the inventive features set forth in the claims and solves the aforesaid problems, by being operative to apply the pulse train to a pulse former (limiter) which generates a square wave having a mark/space ratio of approximately 50/50. The square wave is applied to N-number of EXCLUSIVE-OR circuits (e.g. 4) together with N-number of reference-frequency signals in the form of square waves, which signals differ in timing progressively by 1/Nth of a cycle. The requisite progressive time difference can be obtained, either by commencing with a high frequency and dividing said frequency down, or by utilizing delay lines. It is unimportant to the process which of these methods is used. The mark/space ratio between the N-output signals from the EXCLUSIVE-OR circuits are mutually compared in comparison circuits in order to establish in which of N-rough phase-sectors the signal phase lies. The signal which lies nearest the pulse ratio 50/50 is then selected, filtered in a low-pass filter and digitized in an analogue/digital converter to form a binary code which provides finer phase information within the rough sector that has already been determined. The advantages afforded by the inventive arrangement over known techniques are that time measurements or determinations can be made with an accuracy greater than one period of the highest possible frequency of the reference clock, therewith enabling the operating frequency of the arrangement to be increased without requiring the provision of very high-speed logic. Furthermore, it is not necessary for the reference clock to be related precisely to the frequency of the pulse train to be measured.

BRIEF DESCRIPTION OF THE DRAWINGS

The inventive arrangement will now be described in more detail with reference to an exemplifying embodiment thereof and with reference to the accompanying drawings, in which.

BEST MODE OF CARRYING OUT THE INVENTION

Figure 1:
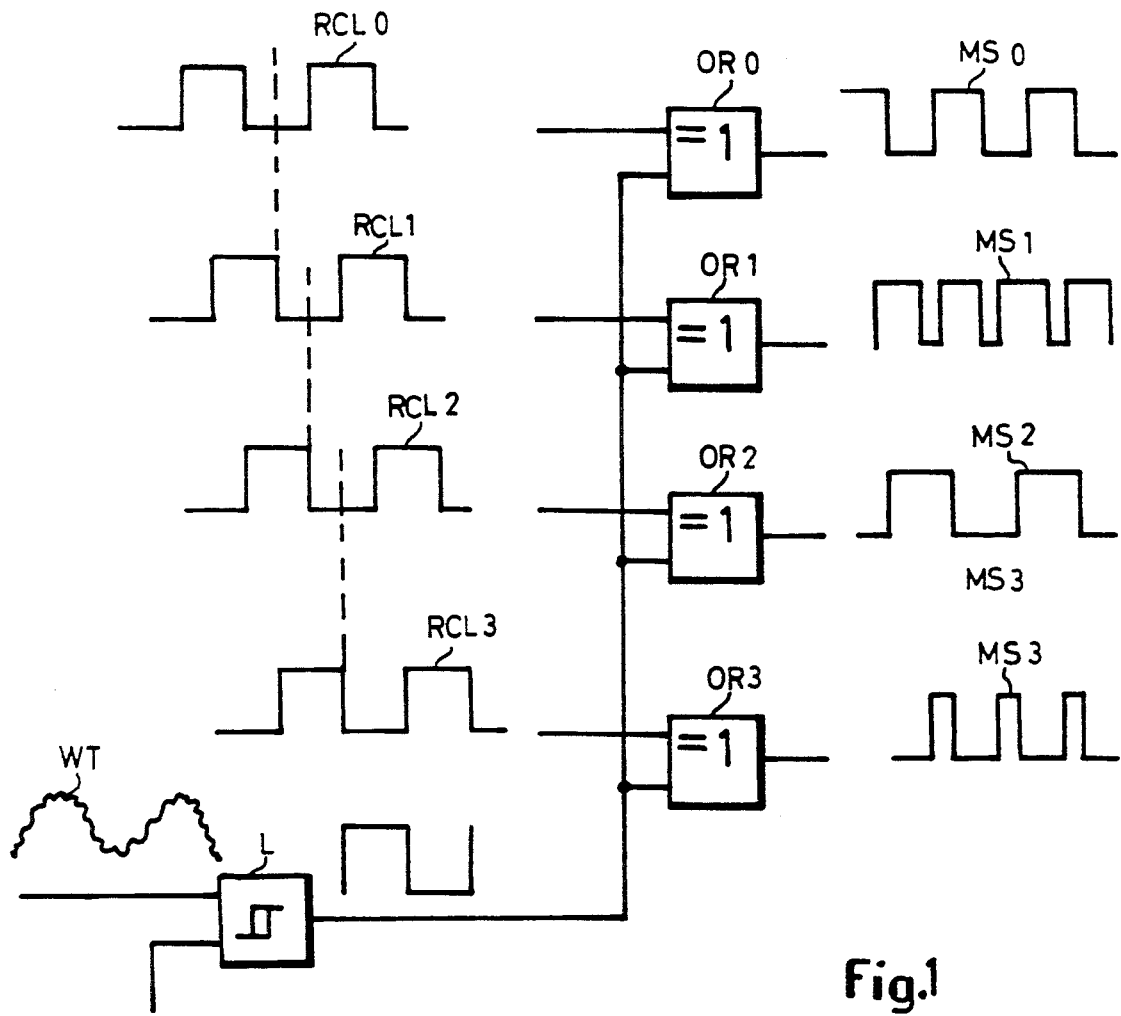
FIG. 1 illustrates pulse-forming and time-displacement of the signals.
Figure 2:
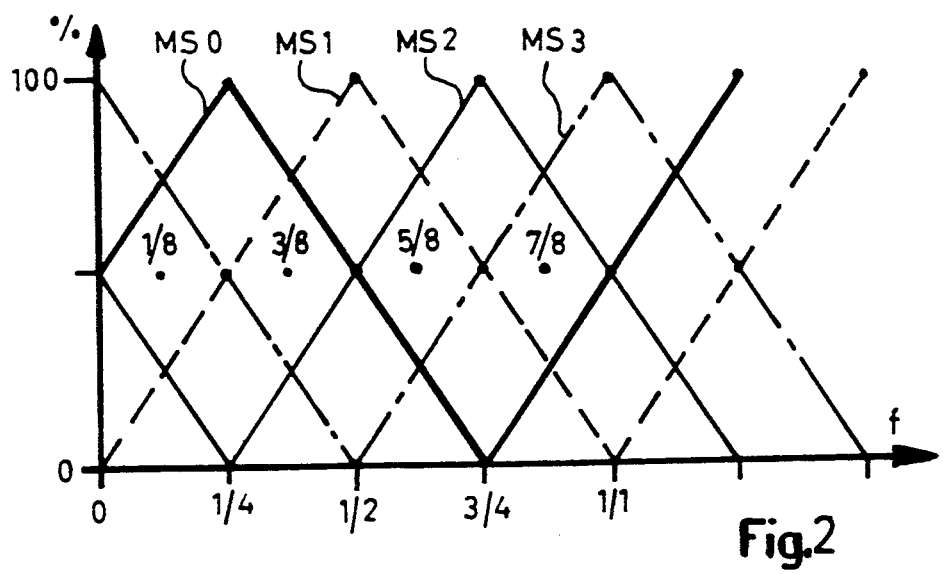
FIG. 2 illustrates how the pulse ratio (mark/space) varies on the outputs of the EXCLUSIVE-OR circuits.

As evident from FIG. 1, a pulse train WT in analogue form is applied to the input of a limiter L. The limiter pulse-forms the signal so as to produce on the output of the limiter a square wave having the pulse ratio (mark/space) 50/50. The square wave is applied to a first input of each of N number of EXCLUSIVE-OR gates, in the illustrated embodiment four gates. A reference clock signal RCL0–RCL3 is applied to a second input of each of said gates, said gates being referenced OR0–OR3. Each of these reference-clock signals are square wave signals and are mutually displaced in time and in sequence by 1/N of a cycle. The output signal from each EXCLUSIVE-OR gate is a square wave signal MS0–MS3 having twice the frequency of the input-signal frequency of respective gates and having a mark/space ratio depending on the mutual clocking of the two input signals of the gates, as evident from the diagram of FIG. 2. The diagram shows variations in the mark/space ratio for the output signals MS0–MS3 from the gates OR0–OR3 as a function of pulse train clocking in relation to reference-clock timing.

Efforts to derive the mutual clocking of the two input signals from the output signal of one single EXCLUSIVE-OR gate will introduce some element of doubt, since it is impossible to ascertain positively which 180 degree range contains the phase, but this problem is solved by mutually comparing the output signals from a plurality of EXCLUSIVE-OR gates. For instance, when N equals 4, in accordance with the illustrated embodiment, it is possible to determine immediately within which ⅛th of the reference-clock period the transitions of the input signal fall. This is effected by comparison between the mark/space ratio of the output signals of the gates OR0-OR3 in accordance with the following MIN of MAX operation:

TABLE 1

If MS0 > MS2 then let B1 = 0 else B1 = 1
If MS1 > MS3 then let B2 = 0 else B2 = 1
If MAX (MS0,MS2) > MAX (MS1,MS3)
let B3 = 0 else B3 = 1.

Figure 3:
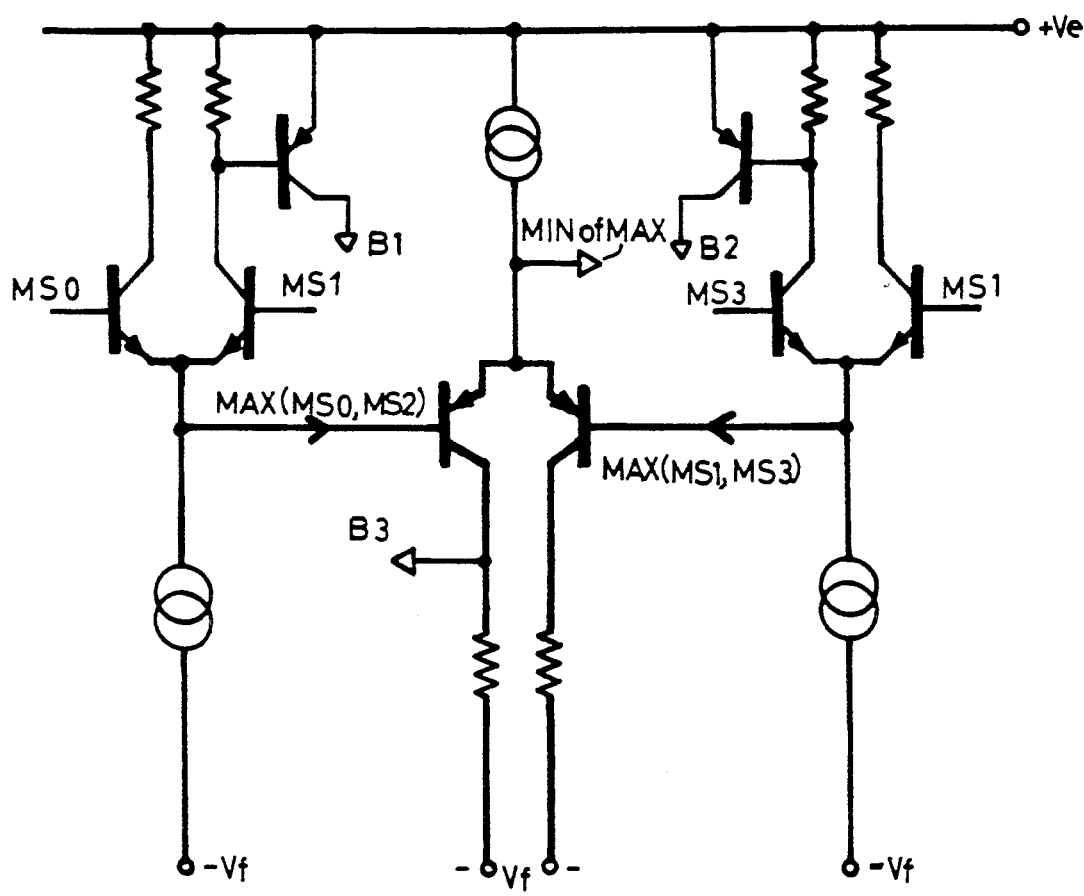
FIG. 3 is a circuit diagram of an inventive comparison circuit.

B1, B2 and B3 determine the three most significant bits in the desired time measuring process subsequent to appropriate code conversion from Gray to Binary form or some other output-signal code. The 3-bit word B1, B2, B3 now has a 1:1 agreement with the octant within which the zero-crossing clocking of the signal lies. The aforesaid described Min of Max-operation can be implemented, for instance, with the aid of a combination of NPN and PNP emitter-followers, as illustrated in FIG. 3, although it can, alternatively, be realized with the aid of comparison circuits (comparators), switches and logic circuits. FIG. 3 thus illustrates one method of determining the three most significant bits of the prevailing measurement value in accordance with Table 1.

In order to be able to determine the three least significant bits LSB when measuring time, it is necessary to determine the mark/space ratio of the signal on the output of at least one of the EXCLUSIVE-OR gates OR0-OR3 more accurately. In practice, it is beneficial to choose the gate whose mark/space ratio lies closest to 50/50, since this pulse form is less sensitive to distortion as a result of the restricted rise times of slow hardware logic. In this case, the three most significant bits B1, B2, B3 determined in accordance with the aforegoing are used to select for finer analysis the pulse which has this property. This is the pulse which remains subsequent to the MIN of MAX operation.

Figure 4:
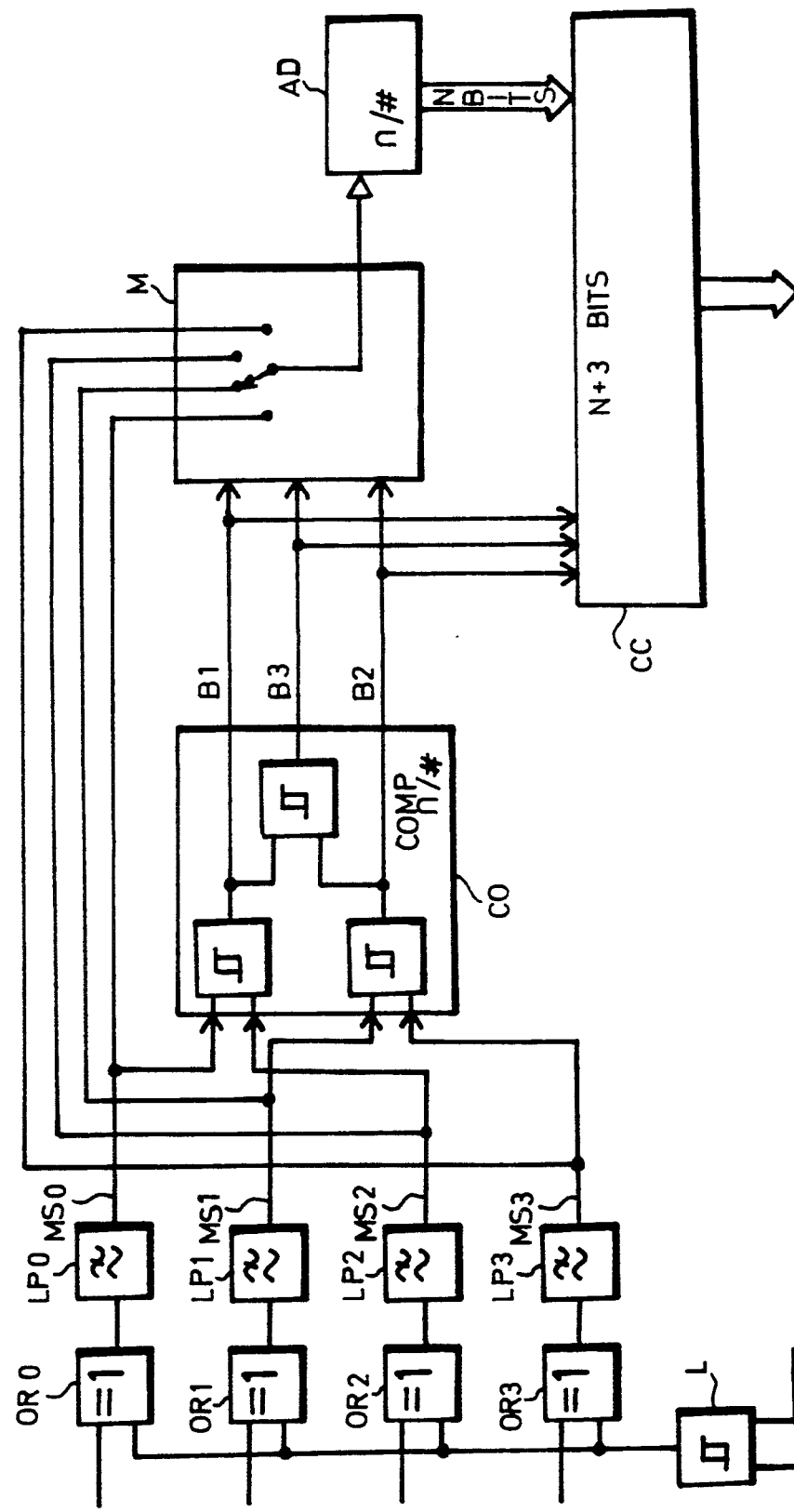
FIG. 4 is a block schematic of an inventive arrangement.

As will be seen from FIG. 4, this finer measurement of the mark/space ratio can be effected with the aid of low-pass filters LP0-LP3 for extraction of the mean value of the signal, followed by analogue/digital conversion in an A/D-converter AD. In the case of a high-speed application, a 4-bit A/D-converter of the "FLASH"-type can be used for instance. The inputs of respective low-pass filters are connected to corresponding outputs of the EXCLUSIVE-OR circuits OR-0-OR3. The filter outputs are connected to inputs of a comparison circuit CO and to the inputs of a multiplexor M. The outputs from the comparison circuit, i.e. the most significant bits B1, B2 and B3, are applied to inputs on the multiplexor M for the purpose of controlling the selection of that gate output-signal (MS0-MS3) whose pulse ratio lies closest to 50/50. The most significant bits are also applied to inputs on a code converter CC. The code converter is constructed either of discrete logic gates or can be a look-up table in an ROM-memory. The memory address consists of the three bits B1, B2, B3 and the bits (four or more) which constitute the result of said A/D-conversion. The memory content consists of the desired output code corresponding to each possible input bit-pattern. The output signal from the multiplexor M is applied to the input of said A/D-converter AD, the outputs of which are connected to corresponding inputs on said code converter CC, the outputs of which, in turn, deliver binary coded signals. When a 4-bit A/D-converter is combined, in this way, with the three most significant bits B1, B2, B3 an accuracy of 7 bits is obtained during the phase-measuring process. Consequently, clocking, e.g., of a pulse train whose repetition frequency is 1 MHZ can be determined with a resolution of 1/128 µs (8 ns) without needing to utilize more than 1 MHZ reference clock-frequency.

If it is desired that a conventional binary code shall represent the timing measurement, it is necessary to convert the three most significant bits from the Gray code to binary code and to complement the three least significant bits LSB in alternating octants. This can be effected with conventional logic, tables or software.

Binary code-representation will facilitate correction of the output value for any difference whatsoever between the reference clock and the expected frequency of the pulse train. Assume that the expected nominal frequency of the pulse train is 1,000,003 HZ but that the frequency of the available reference clocks is precisely 1,000,000 HZ. Assume for the sake of simplicity that the measuring accuracy is 7 bits and that 128 measurements are made each second. The sequence of binary values prior to correction will then have the following configuration for instance: . . . 59, 62, 65, . . . ,122, 125, 0, 3, 6, 9, . . . which illustrates a stepwise increase of 3, modulo 128, depending on said 3 HZ frequency difference. This can be corrected with the aid of a 7-bit external memory whose content is increased with 3, modulo 128, on each sampling occasion, this value being subtracted from the measurement value prior to transmitting an output signal.

A similar technique can also be used when the relationship between sampling period and reference-frequency deviation is more complex and can, for instance, involve increasing the word length of the memory with part quantities, or involve storing a full cycle of correction values in the memory.

This shows that arithmetic configured in software or hardware logic can be utilized for compensating non-integer relationships between the midfrequency, reference clocks and measurement frequency (sampling rate) of the pulse train.

As will be evident from the aforegoing, the inventive arrangement enables a significant improvement in measuring accuracy to be achieved without requiring the provision of very high-speed logic.

I claim:

1. A method for accurate digital determination of the time or phase position of a signal pulse-train in a telecommunication system comprising the steps of:
    forming a square-wave pulse-train from the signal pulse-train,
    comparing the square-wave pulse-train with a plurality of mutually time-displaced square-wave reference signals to form a plurality of new signals having mark/space ratios in dependence on said comparisons;
    mutually comparing the plurality of new signals in a MIN of MAX operation to coarsely determine the time or phase position of the signal pulse-train;
    selecting the new signal whose mark/space ratio lies nearest to a predetermined mark/space ratio;
    converting the selected new signal to digital form;
    applying the coarsely determined time or phase position of the signal pulse-train and the digitized selected new signal to a code converter for producing a binary code value representing the time or phase position of the signal pulse-train, wherein the binary code value can be corrected in respect of systematic deviations resulting from frequency differences among the pulse-train's frequency, the reference signals' frequency and/or a sampling frequency of the pulse-train, by addition/subtraction of a predetermined numerical sequence.

2. The method of claim 1, wherein the step of mutually comparing the plurality of new signals in a MIN of MAX operation comprises the steps of low-pass filtering the plurality of new signals and mutually comparing the low-pass filtered new signals.

3. The method of claim 2, wherein the predetermined mark/space ration is 50:50, and the step of selecting the new signal whose mark/space ratio lies nearest to the predetermined mark/space ratio is based on the MIN of MAX operation.

4. The method of claim 3, wherein the selecting step comprises the steps of applying low-pass filtered new signals to a multiplexer and causing the multiplexer to select one of the low-pass filtered new signals based on the coarsely determined time or phase position of the signal pulse-train produced by the MIN of MAX operation, and the selected new signal is converted to digital form by applying the selected new signal to an analog-to-digital converter.

5. An arrangement for accurately digitally determining the time or phase position of a signal pulse-train in a telecommunications system comprising:

a limiter for forming a square-wave pulse-train from the signal pulse-train;

a plurality of EXCLUSIVE-OR gates, one input of each gate receiving the square-wave pulse-train;

means for generating a plurality of reference clock signals, a respective one of the reference clock signals being applied to a second input of each of the gates, said reference clock signals being displaced sequentially in time in relation to one another, each of the gates producing an output signal having a frequency and a mark/space ratio which is contingent on the ratio between the signals on its first and second inputs;

a multiplexor for selecting one of the output signals;

a comparison circuit in which a MIN of MAX operation is carried out on the output signals, whereby the mark/space ratios of the output signals are mutually compared and that one of said output signals having a mark/space ratio value which lies closest to a predetermined mark/space ratio value is determined, that one output signal being selected by said multiplexor and applied to an input of an analogue/digital converter; and a code converter, wherein the code converter receives on a first number of inputs a signal from the analogue/digital converter and on a second number of inputs a signal from the comparison circuit, and the code converter converts the signals on said first and second number of inputs to signals in binary form which are produced on outputs of the converter and which represent the time or phase position of the signal pulse-train.

6. An arrangement according to claim 5, wherein the signal from the comparison circuit constitutes the three most significant bits of the time or phase position of the signal pulse-train.

7. An arrangement according to claim 5, wherein said predetermined mark/space ratio value is 50/50.

8. An arrangement according to claim 5, wherein the time-displacement between the reference clock signals is 1/Nth of a clock period when the number of reference clock signals is N.

9. An arrangement according to claim 5, wherein the gates' output signals are connected to corresponding inputs of a plurality of low-pass filters and outputs from the filters are connected to the comparison circuit and the multiplexor.

* * * * *